US008536955B2

(12) United States Patent
Stowell et al.

(10) Patent No.: US 8,536,955 B2
(45) Date of Patent: Sep. 17, 2013

(54) INTEGRATED MICROWAVE WAVEGUIDE BLOCK WITH TAPERED IMPEDANCE TRANSITION SECTIONS

(75) Inventors: Michael W. Stowell, Loveland, CO (US); Harald Gaertner, Schoeneck (DE)

(73) Assignee: Applied Materials, Inc., Santa Clara, CA (US)

( * ) Notice: Subject to any disclaimer, the term of this patent is extended or adjusted under 35 U.S.C. 154(b) by 78 days.

(21) Appl. No.: 12/865,645

(22) PCT Filed: Jan. 30, 2008

(86) PCT No.: PCT/US2008/052382
§ 371 (c)(1),
(2), (4) Date: Feb. 8, 2011

(87) PCT Pub. No.: WO2009/096953
PCT Pub. Date: Aug. 6, 2009

(65) Prior Publication Data
US 2012/0148761 A1    Jun. 14, 2012

(51) Int. Cl.
*H01P 5/02* (2006.01)
(52) U.S. Cl.
USPC ............................................. 333/34; 333/248
(58) Field of Classification Search
USPC .......................... 333/34, 248, 239, 253, 263
See application file for complete search history.

(56) References Cited

U.S. PATENT DOCUMENTS

| | | | | |
|---|---|---|---|---|
| 2,437,889 | A | * | 3/1948 | Nordsieck ..................... 333/159 |
| 4,060,778 | A | * | 11/1977 | Hefni et al. ..................... 333/211 |
| 4,282,492 | A | | 8/1981 | MacMaster et al. |
| H321 | H | * | 8/1987 | Riley et al. ..................... 333/239 |
| 5,202,095 | A | | 4/1993 | Houchin et al. |
| 5,292,371 | A | | 3/1994 | Yasui et al. |

(Continued)

FOREIGN PATENT DOCUMENTS

| | | |
|---|---|---|
| JP | 04-136179 | 5/1992 |
| JP | 06-326026 | 11/1994 |

(Continued)

OTHER PUBLICATIONS

International Search Report and Written Opinion, Application No. PCT/US2008/052382, Jul. 8, 2008 (8 pages).

(Continued)

*Primary Examiner* — Benny Lee
(74) *Attorney, Agent, or Firm* — Cooley LLP

(57) ABSTRACT

A microwave waveguide, and a system and method related to a microwave waveguide, is described. One embodiment includes an integrated microwave waveguide comprising a waveguide block, a first waveguide section in the waveguide block, a second waveguide section in the waveguide block, a first impedance transition section integrated with the first waveguide section in the waveguide block, wherein the first impedance section comprises a first conduit with a first end and a second end, wherein the first conduit is tapered from the first end to the second end, and a second impedance transition section integrated with the second waveguide section in the waveguide block, wherein the second impedance section comprises a second conduit with a third end and a fourth end, wherein the second conduit is tapered from the third end to the fourth end, and wherein the second end of the first impedance transition section and the fourth end of the second impedance transition section are connected at an antenna stub.

11 Claims, 12 Drawing Sheets

(56) References Cited

U.S. PATENT DOCUMENTS

| | | |
|---|---|---|
| 6,191,532 B1 | 2/2001 | Liehr |
| 6,607,790 B1 | 8/2003 | Musaka |
| 2002/0144392 A1 | 10/2002 | John et al. |
| 2007/0095281 A1 | 5/2007 | Stowell et al. |
| 2007/0257751 A1* | 11/2007 | Jarno et al. .................... 333/239 |

FOREIGN PATENT DOCUMENTS

| JP | 11-354297 | 12/1999 |
|---|---|---|
| JP | 2005-020077 | 1/2005 |
| JP | 2007-126742 | 5/2007 |

OTHER PUBLICATIONS

Japanese Office Action—Rejection; Japanese Appl. No. 2010-544940, dated Oct. 23, 2012, 3 pages (plus English Translation of 3 pages).

* cited by examiner

US 8,536,955 B2

INTEGRATED MICROWAVE WAVEGUIDE BLOCK WITH TAPERED IMPEDANCE TRANSITION SECTIONS

FIELD OF THE INVENTION

The present invention relates to microwave waveguides.

BACKGROUND OF THE INVENTION

Plasma enhanced chemical vapor deposition (PECVD) is a well-known process for depositing thin films on a variety of substrates. Several industries varying from glass manufacturing, to semiconductor manufacturing, to plasma display panel manufacturing, rely on PECVD systems to deposit thin films upon substrates. PECVD systems vary widely in their application, just as the films they deposit vary widely in chemistry and quality.

Typical PECVD processes can be controlled by varying process parameters such as gas pressure, power, power pulsing frequency, power duty cycle, pulse shape, and several other parameters. Despite this high degree of customization available in PECVD processes, the industry is continually searching for new ways to improve the PECVD process and to gain more control over the process. In particular, the PECVD industry seeks to utilize PECVD over a wider range of process parameters.

Currently, PECVD can only be used in a limited set of conditions. For other conditions, alternative deposition processes must be used. These alternative deposition processes, such as electron cyclotron resonance (ECR) and sputtering, are not always optimal for many applications. Accordingly, the industry has been searching for ways to extend the application of PECVD into areas traditionally reserved for these alternative deposition methods.

Additionally, PECVD microwave plasma sources have generally been a limited or unsuitable source for ions or other plasma species. Ions sources have many beneficial uses related to PECVD processes. For example, ion sources are often used to pretreat surfaces, such as polymer substrates, in preparation for deposition of thin films. Ion sources are also used to change the chemistry and structure of thin films during plasma deposition processes. Additionally, ion sources can be used to remove charge buildup from films or to clean surfaces. Although alternative ion sources can be combined with microwave plasma sources in PECVD, the PECVD process itself has been insufficient as its own ion source.

Ion sources are available from a variety of vendors and are known in the art. But these ion sources typically suffer from several drawbacks. One drawback is that linear ion sources are overly expensive and complicated for many uses. In fact, many applications that would benefit from ion sources forego their use because of the high costs. Another drawback is that current ion sources tend to produce ions with too much energy. Most ion sources produce ions with over 120 eV of energy. In many applications, ions with this much energy can damage the surface being treated or damage the film being deposited.

Although present devices and methods are functional, they are not sufficiently accurate or otherwise satisfactory. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention relates to microwave waveguides. In one exemplary embodiment, the present invention can include an integrated microwave waveguide comprising a waveguide block, a first waveguide section in the waveguide block, a second waveguide section in the waveguide block, a first impedance transition section integrated with the first waveguide section in the waveguide block, wherein the first impedance section comprises a first conduit with a first end and a second end, wherein the first conduit is tapered from the first end to the second end, and a second impedance transition section integrated with the second waveguide section in the waveguide block, wherein the second impedance section comprises a second conduit with a third end and a fourth end, wherein the second conduit is tapered from the third end to the fourth end, and wherein the second end of the first impedance transition section and the fourth end of the second impedance transition section are connected at an antenna stub.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION OF THE INVENTION

Figure 1:
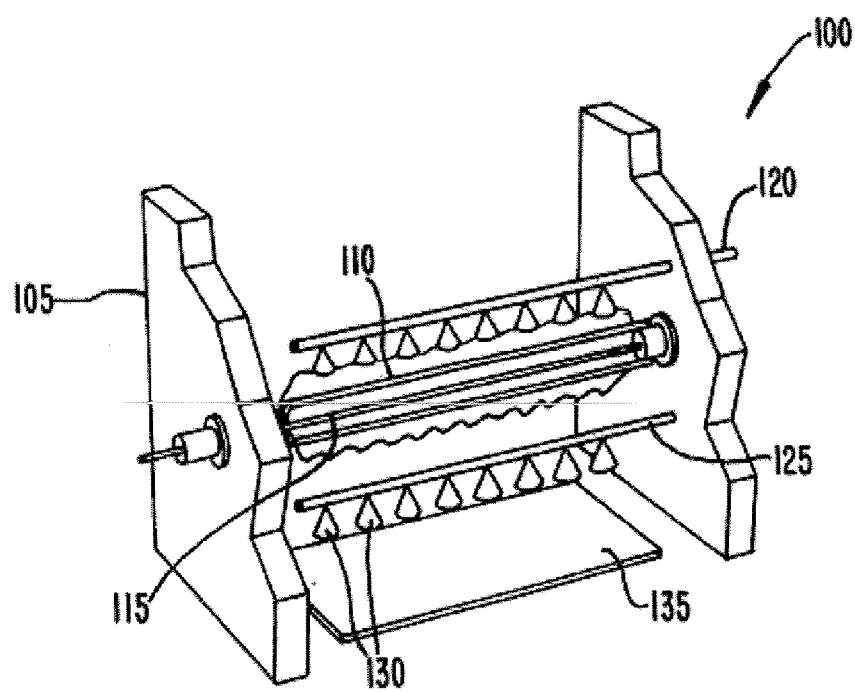
FIG. 1 is an illustration of an existing PECVD system.

Referring now to the drawings, where like or similar elements are designated with identical reference numerals throughout the several views, and referring in particular to FIG. 1, it illustrates a cut away of a typical PECVD system 100 for large-scale deposition and etch processes. This system includes a vacuum chamber 105 of which only two walls are illustrated. The vacuum chamber houses a discharge tube 110. The discharge tube 110 is formed of an antenna 115 that is configured to carry a microwave signal, or other signals, into the vacuum chamber 105. This microwave power radiates outward from the antenna 115 and ignites and fractionalizes the surrounding support gas that is introduced through the support gas tube 120. This ignited gas is a plasma and is generally adjacent to the discharge tube 110. Radical species generated by the plasma and electromagnetic radiation disassociate the feedstock gas(es) 130 introduced through the feedstock gas tube 125 thereby breaking up the feedstock gas to form new molecules. Certain molecules formed during the disassociation process are deposited on the substrate 135. The other molecules formed by the fractionalization and disassociation processes are waste and are removed through an exhaust port (not shown)—although these molecules tend to occasionally deposit themselves on the substrate.

Nonconductive and conductive films deposited utilizing plasma enhanced chemical vapor sources have been achieved with many types of power sources and system configurations. Most of these sources utilize microwaves, HF, VHF energy to generate the plasma and excited plasma species. It has been discovered that it is the average power applied to and discharged from the antenna that is the major contributing factor to the density of radicalized plasma species produced.

Film properties requirements are achieved by varying the process conditions during deposition, including the power levels, pulsing frequency and duty cycle of the source. To achieve required film properties the structure and structural content of the deposited film must be controlled. The film properties can be controlled by varying the radical species content, (among other important process parameters), and as stated above, the radical density is controlled primarily by the average and peak power levels into the plasma discharge.

To achieve several important film properties, and promote adhesion to some types of substrates, the films organic content must be finely controlled, or possibly the contents must be in the form of a gradient across the entire film thickness.

In a typical PECVD process, only a small fraction of the supporting gas is actually fractionalized. For example, as little as 2% of the support gas is typically fractionalized. The amount of gas fractionalized is determined by the pressure of the supporting gas and the amount of power applied to the antenna in the discharge tube. The relationship between pressure, power and configuration is defined by the Paschen curve for any particular supporting gas.

Most fractionalization of the supporting gas is caused by electrons generated by the power applied to the antenna in the discharge tube. Some fractionalization is also caused by ions and other plasma radicals. The effectiveness of electrons in fractionalizing a supporting gas is directly linked to electron density. In areas of higher electron density, fractionalization rates are higher for the same supporting gas pressures.

For a typical PECVD process the necessary density of produced radicalized species from the plasma must be greater than that required to fully convert the required amount of feedstock gas. This is because some of the radicalized species from the plasma are consumed not only in the film deposition processes and plasma decomposition processes of the feedstock gas but also in unrelated portions of the deposition process, such as recombination mechanisms and pumping.

Depending upon the power type, level, and/or configuration and the materials utilized, the required power level can unduly heat the substrate beyond its physical limits, and possibly render the films and substrate unusable. This primarily occurs in polymer material based substrates due to the low melting point of the material.

To reduce the amount of heat loading of the substrate, a method of high power pulsing into the plasma, with off times in between the pulsing has been used. This method allows the plasma during the short high energy pulses to reach saturation of the radicalized species required for the film deposition process and loss to occur, while reducing the instantaneous and continuous heating of the substrate through the reduction of other forms of electromagnetic radiation.

Figure 2:
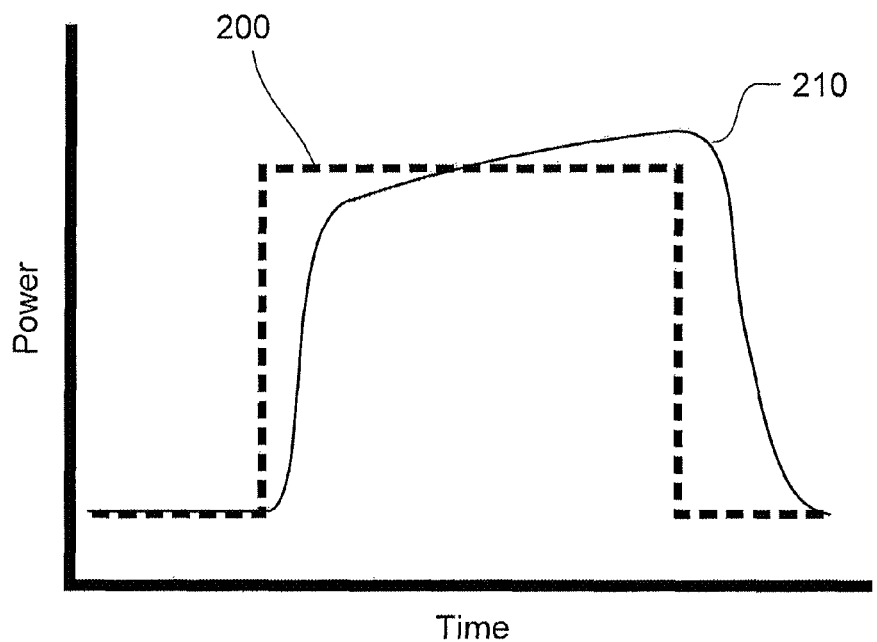
FIG. 2 is a representation of a waveform of a power pulse into a microwave antenna and the resulting total plasma light emission consistent with existing technology.

However, while pulsed microwave has been proven to benefit the process by reducing the thermal load on the substrate, deposition rates in general are typically lower than that of continuous wave (CW) power sources. This partly is due to the energy lost to the breakdown process of the discharge itself Shown in FIG. 2 is a representation of a typical waveform of a power pulse 200 into a microwave antenna and the resulting total plasma light emission 210. As will be recognized by those skilled in the art, a vertical scale is a measure of power in the pulse over a time interval along the horizontal scale, where the vertical scale for the power pulse 200 and plasma light emission 210 are not the same, and are depicted here for illustration only. In a typical PECVD process, the loss of energy is roughly 20% of the total power. A significant portion of this energy loss is due to the energy required for ignition of the plasma discharge. FIG. 2 shows the significant loss of power spent igniting and stabilizing the discharge.

By sustaining a background minimal level of plasma ionization, and preventing the plasma from extinguishing, the loss of power into the plasma required for the initial ignition and stabilization of the plasma discharge is significantly reduced. For example, a background minimal level of plasma ionization could be sustained through modulation of the microwave power source, phasing of pulsed sources, or by the addition of external sources such as AC or RF glow discharge. These methods are exemplary only and not meant to limit the present invention. Modulation of the microwave power source, for example, could include pulsing the power source up from an initial power amplitude, to the full pulse amplitude, and then returning to an initial power amplitude. In one embodiment, the initial power amplitude would be a low power level that is sufficient to sustain a background minimal level of plasma ionization. Those skilled in the art will realize alternative methods and systems consistent with the present invention.

Figure 3:
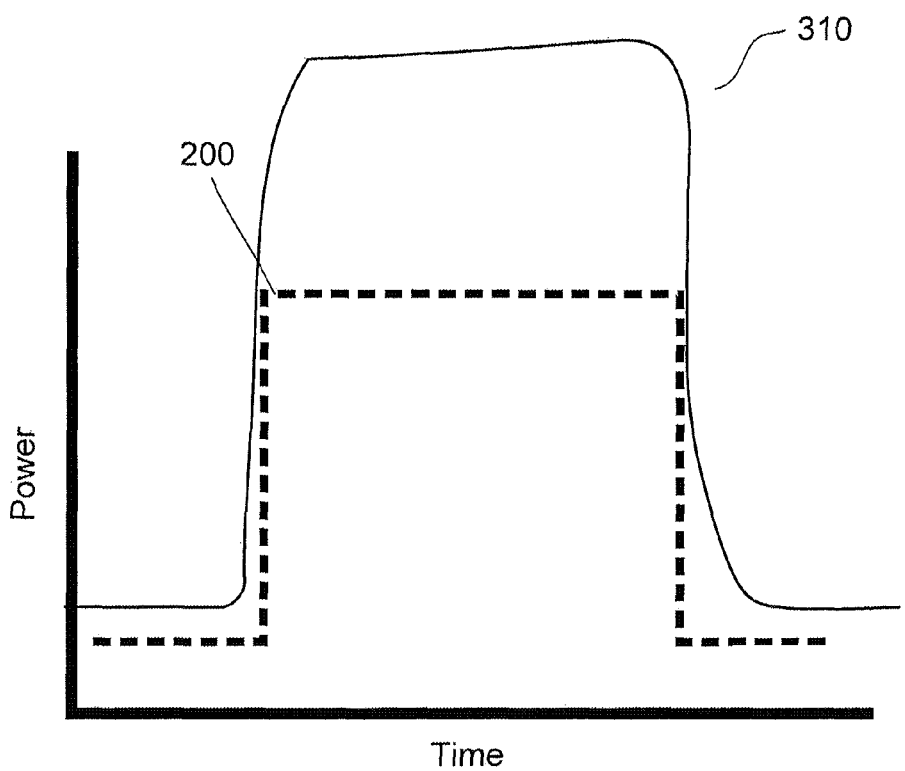
FIG. 3 is a representation of a waveform of a power pulse into a microwave antenna and the resulting total plasma light emission consistent with the present invention.

FIG. 3 depicts a power pulse 200 and plasma light emission 310 consistent with the present invention. As will be recognized by those skilled in the art, a vertical scale is a measure of power in the pulse over a time interval along the horizontal scale, where the vertical scale for the power pulse 200 and plasma light emission 310 are not the same, and are depicted here for illustration only. It should also be recognized, however, that the peak levels of plasma light emission 310 using the background energy have been tested at around four times the peak levels of plasma light emission 210 when a background energy is not used. Utilizing a small amount of background energy keeps the plasma sustained so that when the power pulse 200 is applied, the energy into the plasma discharge is of a greater amount. Since less energy is used to excite the plasma, more energy is allowed to excite radical species.

By maintaining a background minimal level of plasma ionization the power into the plasma typically was increased from a level of 75% to 95% due to the ionization efficiency increase gained by not needing energy to ignite a discharge. Referring back to FIG. 1, this background minimal level of plasma ionization could be sustained by applying power to the support gas tube 120 or feedstock gas tube 125. In one embodiment of the present invention, the power applied to either tube could be an RF or AC glow discharge. In another embodiment of the present invention, a bias could be applied to the substrate 135 itself for the purpose of pre-ionization. Other embodiments are disclosed herein, but are exemplary only, as those skilled in the art will be aware of modifications consistent with the present invention.

Figure 4:
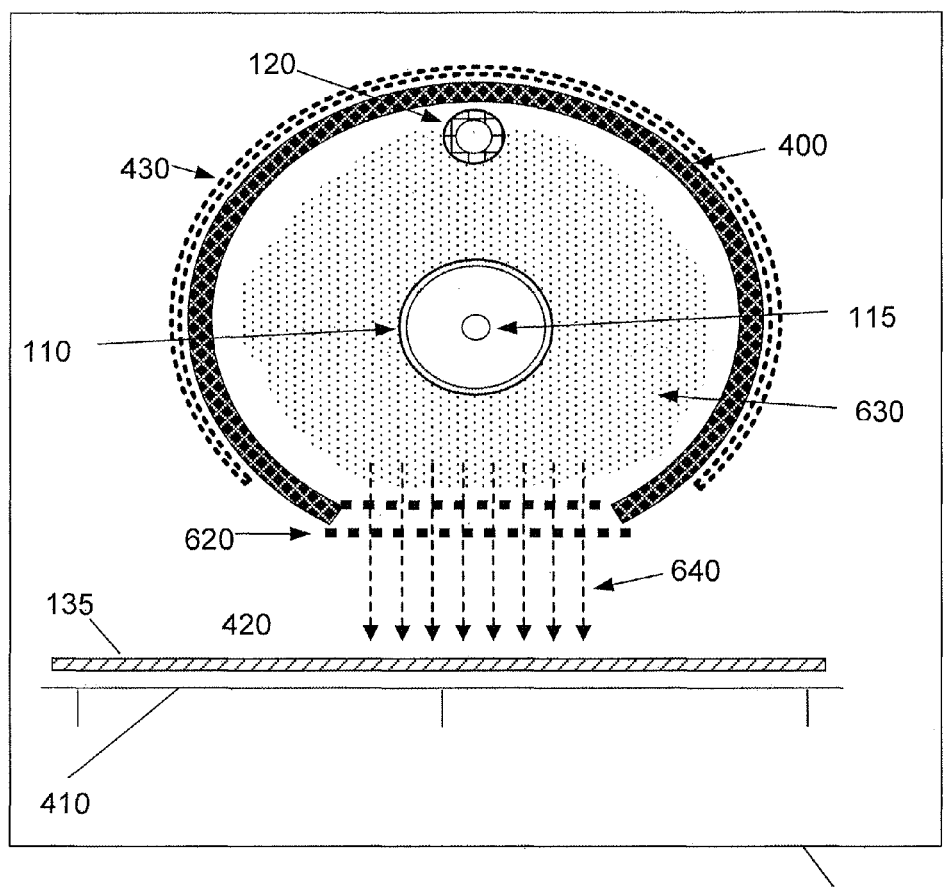
FIG. 4 illustrates a system for producing plasma radicals for surface treatment, thin film deposition, and/or film chemistry or structure alteration, constructed in accordance with one embodiment of the present invention.

Fractionalization efficiency can also be greatly enhanced by utilizing a containment shield near the discharge tube. The benefits of containment shield utilization is discussed in commonly owned and assigned U.S. patent application Ser. No. 11/558,266, filed Nov. 9, 2006, entitled SYSTEM AND METHOD FOR CONTAINMENT SHIELDING DURING PECVD DEPOSITION PROCESSES, which is incorporated herein by reference. A cross section of an exemplary design of a containment shield 400 that could be utilized in a PECVD process is shown in FIG. 4. The containment shield 400 is generally formed of a dielectric material, such as quartz, and provides a volume around the discharge tube 110 into which the supporting gas can be pumped. The exact volume of the containment shield 400 and the distance between the discharge tube 110 and the inner surface of the containment shield 400 can be varied based upon the desired film chemistry, the overall construction of the PECVD system and the desired gas pressures.

The containment shield 400 acts to contain electrons and other radicalized plasma species that would otherwise escape. By containing electrons, the electron density around the discharge tube 110 can be increased at distances further from the discharge tube 110. And by increasing electron density, the plasma can be extended further with the same process parameters—meaning that the fractionalization rate can be increased without changing other process parameters.

The containment shield 400 also helps prevent radicals and ions from escaping. This can help the fractionalization efficiency and prevents generated radicals and ions from being wasted. And by preserving these particles, the PECVD system can be operated over a wider range of operational parameters and operated more efficiently.

It should be noted that these embodiments are not limited to a PECVD system. Those of skill in the art could extend the concepts of the present invention to cover any type of plasma system.

Containment shields also advantageously provide better control over supporting gas pressures around the discharge tube 110. First, containment shields help provide a more uniform supporting gas pressure than was possible without a containment shield. This more uniform pressure allows the fractionalization rate to be better controlled and thus increased.

Second, containment shields provide the ability to have a different pressure within a containment shield than in the remaining portions of the process chamber. This is advantageous because a higher pressure can be maintained within a containment shield and a lower pressure can be maintained in the remaining portions of the process chamber. The result of this variable pressure allows more radicals to be produced at an overall lower process chamber pressure. This type of control allows PECVD processes to be run at significantly lower process chamber pressures than previously possible.

Further illustrated in FIG. 4 are the process chamber 105, the substrate 135, the substrate support 410, the discharge tube 110, the antenna 115, the containment shield 400, a microwave reflector 430, and a supporting gas tube 120. The supporting gas tube 120 is located inside the containment shield 400 in this depiction.

The containment shield 400 includes an aperture 420 nearest the substrate 135. It is through this aperture 420 that the radicals escape and collide with the feedstock gas. The size of this aperture 420 can be varied either manually or electronically to control the number of radicals escaping from the containment shield 400. It can also be a fixed-size aperture.

In some embodiments, the pressure within the containment shield 400 can be higher than the pressure outside the containment shield 400. Thus, the general PECVD process can be operated at a lower pressure while the plasma enhancement process and the radical production process can be operated at a much higher pressure. As previously discussed, pressure is a key factor in the fractionalization efficiency of the support gas. Up to a certain point, higher pressure enables higher fractionalization efficiencies. Thus, the higher pressure allowed inside a containment shield enhances the fractionalization efficiencies.

The efficiency of containment shields depends, at least partly, on the shields' effectiveness in properly channeling and preventing the escape of the electrons, ions and radicals. For this reason, the containment shield is generally formed from a dielectric material like quartz. The expense, fragility, and limitations on machinability of dielectric materials such as quartz, however, presents certain restrictions on containment shields.

Figure 5:
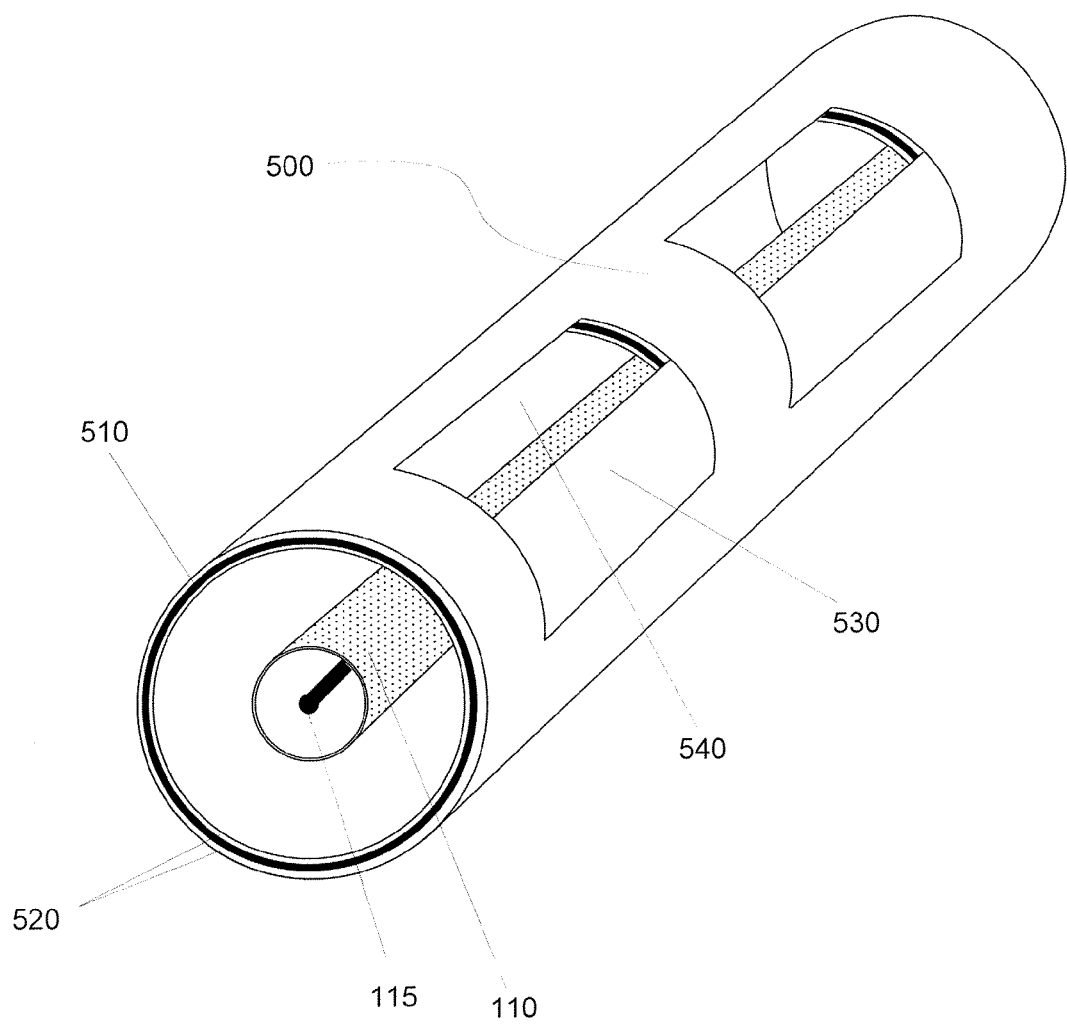
FIG. 5 is an illustration a containment shield constructed in accordance with one embodiment of the present invention.

FIG. 5 illustrates a containment shield 500 in accordance with one embodiment of the present invention. FIG. 5 depicts a tube 510 that has been pre-coated with a dielectric coating 520 and placed around a discharge tube 110 so that the volume of gas within the tube 510 can be more fully ionized to achieve greater fractionalization. In this embodiment, the discharge tube 110 is a linear discharge tube with a single antenna 115. In another embodiment, the containment shield 500 consists of a quartz tube which is wrapped with a conductor (not shown). Instead of a conductor which is pre-coated with a dielectric coating, now a dielectric base material wrapped or coated with a conducting layer is used. All references herein to a dielectric coating 520 on a base material 510 are for illustration only and the construction of a containment shield using a dielectric material coated with a conducting layer is also understood in the present application. Those skilled in the art will be aware of many modifications, including non-linear discharge tubes and split antenna, consistent with the present invention.

In one embodiment of the present invention, the tube 510 could be coated with alumina in order to form the dielectric coating 520. Other dielectric materials could be used to form the dielectric coating 520 depending on the requirements of the system. Those skilled in the art will be aware of variations consistent with present invention.

The embodiment in FIG. 5 also shows slots 530 with variable slot apertures 540. The variability of the slots 530 can be used to control process parameters such as the density of UV radiation, internal and external pressure differential, and flow into or out of the tube. The slots 530 could also be of a fixed size. The configuration of the shielding could be varied in many ways, including: size, shape, material, number of shields, number of slots, the addition of an outer metal shield to reflect lost electromagnetic radiation back into the plasma pipe volume, etc. For example, the tube 510 could be constructed out of metal. While metal itself will not produce the desired containment effects, by pre-coating the metal with a dielectric material an effective containment shield 500 can be produced. Moreover, the metal would also be able to reflect electromagnetic radiation back toward the discharge tube 110 for increased ionization efficiency. In another embodiment, a dielectric body, such as a quartz tube, is wrapped with a conducting layer, such as metal, to obtain both desired containment effects and reflection of electromagnetic radiation.

By utilizing containment shields, and by pre-coating a base material with a dielectric coating before the containment shield is used in the PECVD process, there will be a significant reduction in the time the systems will have to be offline for cleaning. This is because the dielectric materials can sustain a high temperature during the PECVD process. At temperatures around 200-300° C. for most processes, the dielectric coating will resist deposition on the surfaces surrounding the discharge tube and eventual flaking.

Additionally, utilizing containment shields and pre-coating any base materials with a dielectric coating will greatly reduce any pre-start time for the PECVD system. Typically, a PECVD system has to be pre-started in order to allow for a layer of deposition to form on the surfaces surrounding the discharge tube. This allows the plasma density to stabilize before beginning the deposition process. The current invention allows for plasma densities to be immediately stabilized and therefore reduces pre-start time.

The exemplary containment shield 500 from FIG. 5 may also be used as a source of power for sustaining a minimal background level of ionization. By pre-coating the tube 510, that tube 510 comprised of an electric conductor, with a dielectric coating 520, all the benefits of a containment shield are retained with the added benefit that the containment shield 500 can act as the power source for pre-ionization of the plasma. In one embodiment, a power source could be applied to the conductive portion of the containment shield 500 in order to sustain a minimal background level of plasma ionization and increase the ionization efficiency. In another embodiment, a conductive material (not shown) could be added to the tube 510 and then both the tube 510 and the conductive material (not shown) could be pre-coated with a dielectric coating 520. Those skilled in the art will be aware of alternative systems and methods consistent with the present invention.

Figure 6:
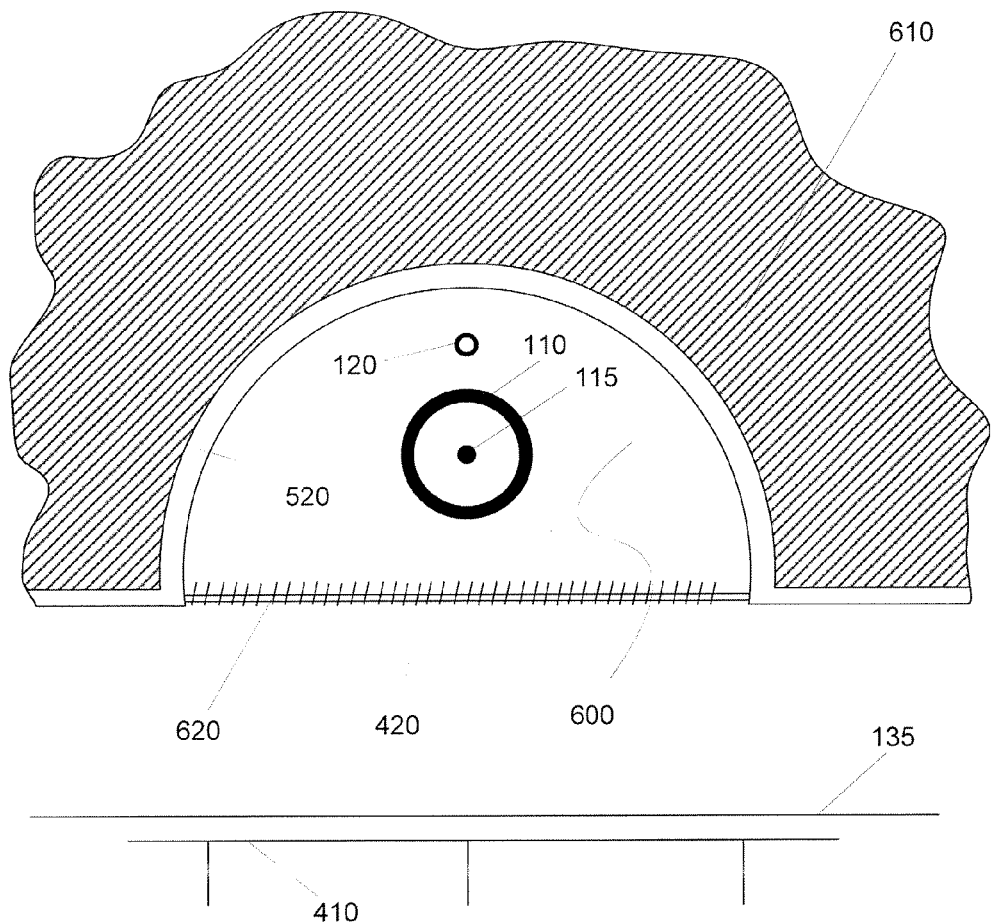
FIG. 6 illustrates a system for producing plasma radicals for surface treatment, thin film deposition, and/or film chemistry or structure alteration, constructed in accordance with one embodiment of the present invention.

FIG. 6 illustrates another embodiment of a containment shield 600 consistent with the present invention. In FIG. 6 a cross sectional view of a containment shield 600 that could be used in a PECVD process is shown. In this embodiment, a discharge tube 110 and support gas tube 120 are shown partially surrounded by a containment shield 600. This containment shield 600 is formed using a dielectric coating 520 on a base material 610 such as metal. Here the containment shield 600 is shown with a circular profile, where aperture 420 in the containment shield is nearest the substrate 135. It should be recognized by those skilled in the art that any profile could be used, and that the circular profile shown here is exemplary only. Alternative profiles could be used to control certain process parameters. For example, a profile that increases the resonance time of the support gas could be used to further increase ionization efficiency.

As was previously discussed, the dielectric coating 520 that is pre-coated on the base material 610 will heat during the microwave pulsing. The benefits of allowing the dielectric coating 520 to heat have been previously discussed. The heating, however, could potentially cause problems keeping the dielectric coating 520 affixed to the base material 610. In one embodiment of the present invention, a temperature control system (not shown) can be used to help control the temperature of the base material 610. The base material 610 could be heated near the dielectric coating 520 and cooled further away. Cooling may be used to keep the base material 610 from affecting exterior portions of the system and to prevent warping. By controlling the thermal gradient across the dielectric coating 520 and through the base material 610 the benefits of a high temperature dielectric coating 520 can be retained without losing adhesion of the dielectric coating 520 itself.

Further illustrated in FIG. 6 is a plasma species extraction grid 620 placed over the aperture 420 in the containment shield 600. This plasma species extraction grid 620 could be used to energize and extract ions, electrons, or other plasma species, from the plasma created around the discharge tube 110. In one embodiment of the present invention, a DC, RF, or AC potential may be applied to the plasma species extraction grid 620 in order to accelerate and control the direction of ions or other plasma species out of the containment shield 600. In another embodiment, the potential applied to this plasma species extraction grid 620 could also be used for sustaining a background minimal level of plasma ionization between power pulses.

In an embodiment consistent with the present invention, a support gas is introduced through the support gas tube 120 in FIG. 6. Excitation of the support gas is accomplished by subjecting the gas to microwave power from the antenna 115. Free electrons gain energy from the imposed microwave field and collide with neutral gas atoms, thereby ionizing those atoms including fractionalizing the supporting gas to form a plasma. This plasma contains partially ionized gas that consists of large concentrations of excited atomic, molecular, ionic, and free radical species. These particles impact the substrate 135, and depending upon the process employed, clean the substrate 135, modify the surface, or remove excess electrical charge. It is the interaction of these excited species with solid surfaces placed in or near the plasma that results in the chemical and physical modification of the material surface.

In most microwave based processes, however, the ions never gain enough energy to reach the substrate 135. By placing the plasma species extraction grid 620 over the aperture 420 and applying a potential, the ions, or other plasma species, can be accelerated and directed so that they impact the substrate 135. In one embodiment, the microwave power plasma source could be used as an ion source. Such an ion source could produce high ion densities with various electron voltages, depending on the potential applied to the plasma species extraction grid 620.

Although the plasma species extraction grid 620 could be constructed from many materials consistent with the present invention, using etch resistant materials such as Tungsten will help prevent any sputtering effects from the plasma species extraction grid 620 itself. Moreover, by allowing the plasma species extraction grid 620 to heat up, deposition on the plasma species extraction grid 620 itself, and any subsequent flaking, can also be prevented.

The plasma species extraction grid 620 can be added to many microwave power source systems in accordance with the present invention. The description of the plasma species extraction grid 620 with the current embodiment is by example, and not intended to limit the present invention. For example, in another embodiment the plasma species extraction grid 620 could be added over the apertures 540 from FIG. 5. Those skilled in the art will be aware of many systems and methods consistent with the present invention.

Referring back now to FIG. 4, a plasma species extraction grid 620 is shown placed over the aperture 420 of the containment shield 400. During operation of the exemplary system, a plasma 630 forms around the discharge tube 110. In this embodiment, the shape of the containment shield 400 and the size of the aperture 420 can assist in directing any escaping ions or other plasma species down toward the substrate. Consistent with an embodiment of the present invention, the plasma species extraction grid 620 can also be used to further control, accelerate, and to energize ions or other plasma species. These extracted plasma species 640 are shown being directed towards the substrate 135.

Figure 7:
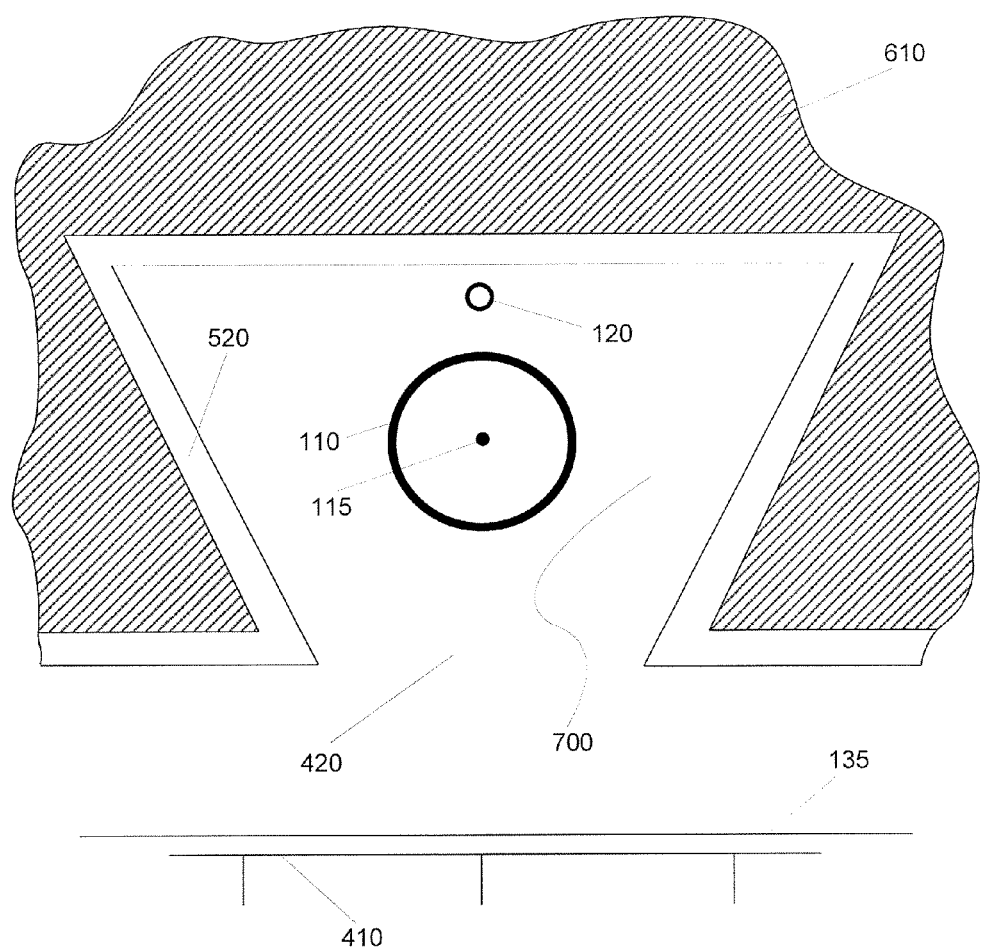
FIG. 7 illustrates a cross section of a profile of a containment shield constructed in accordance with an embodiment of the present invention.

FIG. 7 illustrates a containment shield 700 with an alternative profile consistent with the present invention. The shape of the containment shield 700 can be varied to control surface treatment properties. For example, the shape of the containment shield can be optimized from one application to another for specific energetic species and radical/metastable conditions, to achieve specific deposited or etched material properties. In this embodiment, the containment shield 700 is constructed with more of a triangular profile. The exemplary profile creates an increased baffle for the support gas supplied from the support gas tube 120. The increased baffle lengthens the resonance time for the support gas. The resonance time is greater because of the increased time it takes for at least some of the gas to pass from the support gas tube 120 out through the aperture 420 in the containment shield 700 and down toward the substrate 135. The increased resonance time allows for increased ionization efficiency and greater fractionalization of the support gas. Those skilled in the art will be aware of further profiles consistent with the present invention.

Various profiles can be constructed depending on the specific application. The present invention allows greater flexibility in constructing such profiles. Base materials, with greater machinability and lower cost than dielectric materials, can be used to form profiles of any shape. Consistent with one embodiment of the present invention, these profiles can then be pre-coated with a dielectric coating to form a containment shield. Those skilled in the art will be able to construct many profiles consistent with one embodiment of the present invention.

Figure 8:
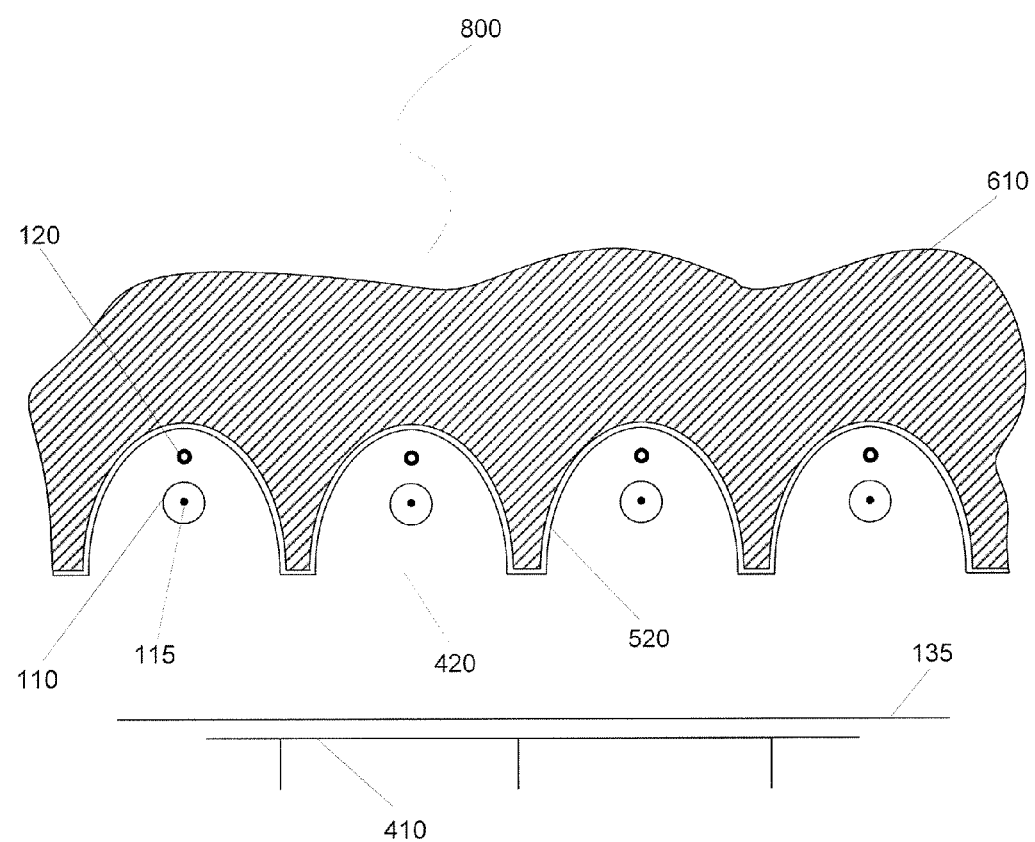
FIG. 8 illustrates a cross section of a PECVD array constructed in accordance with one embodiment of the present invention.

In FIG. 8 there is an illustration of an exemplary embodiment of a containment shield 800 for a static array of discharge tubes 110. FIG. 8 shows a cross-sectional view of a containment shield 800 that could be used in a PECVD process consistent with the present invention. In this exemplary embodiment, a static array of discharge tubes 110 and support gas tubes 120 are shown partially surrounded by a containment shield 800. The containment shield 800, which is formed using a dielectric coating 520 on a base material 610 such as metal, is placed such that the apertures 420 will guide gas from the support gas tubes 120 out through apertures 420 down toward the substrate 135. In this exemplary embodiment, the containment shield 800 has slightly oval profiles. As previously discussed, other profiles could be used consistent with the present invention. The present embodiment also uses a consistent profile along the static array of discharge tubes 110. This is exemplary only. Those skilled in the art will realize many variations and modifications consistent with the present invention. Moreover, it will be realized by those skilled in the art, that a plasma species extraction grid 620 can be placed over the apertures 420 in order to gain the benefits of plasma species directionalization and acceleration that are described herein.

Depending on the base material in FIG. 8, the containment shield 800 can also act to either block energy transfer between the antennas 115 or to allow energy transfer between the antennas 115. The benefits of an energy blocking base material 610 were discussed with respect to FIG. 5 and the benefits of allowing energy transfer between the antennas is discussed with respect to FIG. 9. Nothing in the present invention should be read to limit the type of material that could be used as the base material 610.

Figure 9:
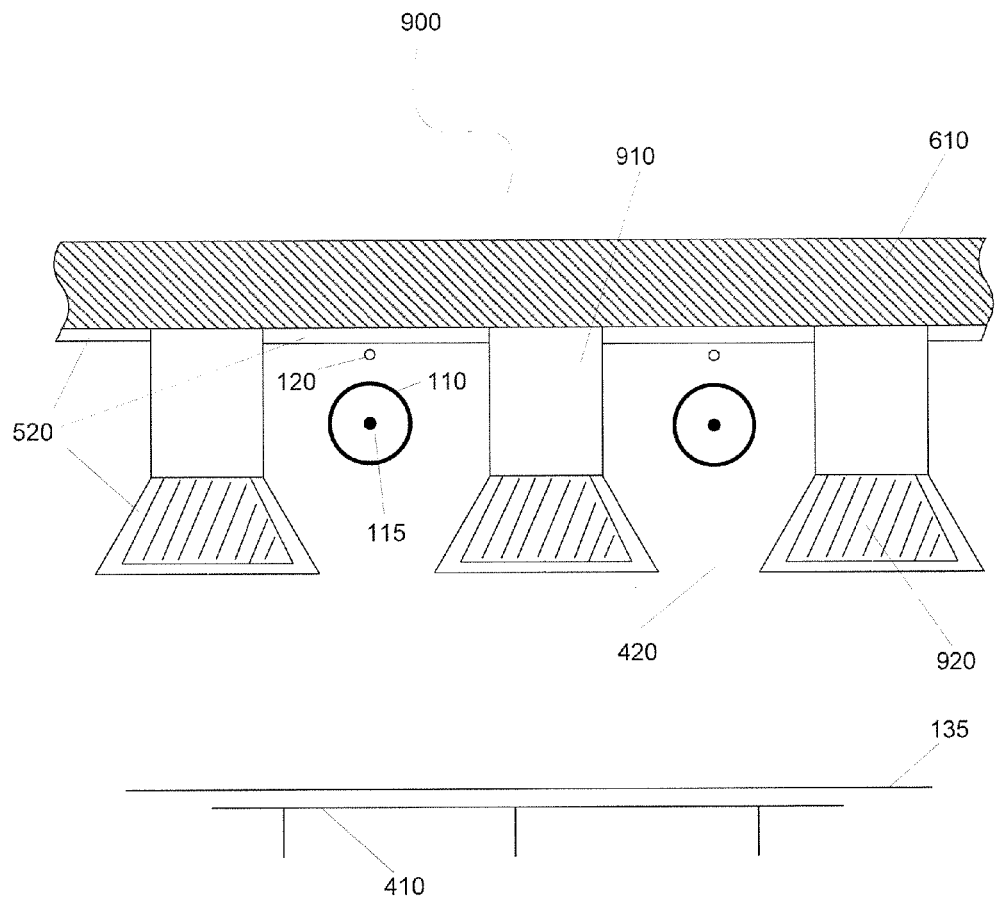
FIG. 9 illustrates a cross section of a PECVD array constructed in accordance with one embodiment of the present invention.

Now referring to FIG. 9 there is an illustration of another embodiment consistent with the present invention. In this embodiment, a static array of discharge tubes 110 and support gas tubes 120 are shown partially surrounded by a containment shield 900. The containment shield 900 is formed using dielectric dividers 910 placed between the discharge tubes 110. By using dielectric dividers 910 positioned between the discharge tubes 110, energy transfer is allowed between the antennas 115. This energy transfer can be used to produce the pre-ionization effects required to sustain a plasma around each discharge tube 110 while an antenna 115 is in an off phase of its power cycle. For example, in one embodiment of the present invention, adjacent antenna 115 could be controlled by a timing control that phases the pulsed sources. This phasing could be implemented so that a minimal background level of plasma ionization is sustained due to the energy transferred from the adjacent antenna 115.

The dielectric dividers 910 are then connected to a base material 610 such as metal. The base material 610 is pre-coated with a dielectric coating 520 on, at least, any surfaces that are exposed to, and help partially enclose, the discharge tube 110. FIG. 9 also shows baffles formed using a dielectric coating 520 that is pre-coated on a baffle material 920 such as metal. The baffle has been added to help increase the resonance time of the gas from the support gas tube 120. Other shapes and designs could be used to control other process parameters.

In one embodiment of the present invention, the baffle material 920 could be constructed out of a microwave reflecting material like metal, such that some of the energy emitted by the antenna 115 will be reflected back towards the plasma around the discharge tube 110. Those skilled in the art will realize many modifications to the size, shape, material composition, etc. that can be made consistent with the present invention. For example, the baffle in this embodiment may be removed. Alternatively, the shape and/or orientation of the dielectric divider 910 could be changed so as to create a baffle.

Figure 10:
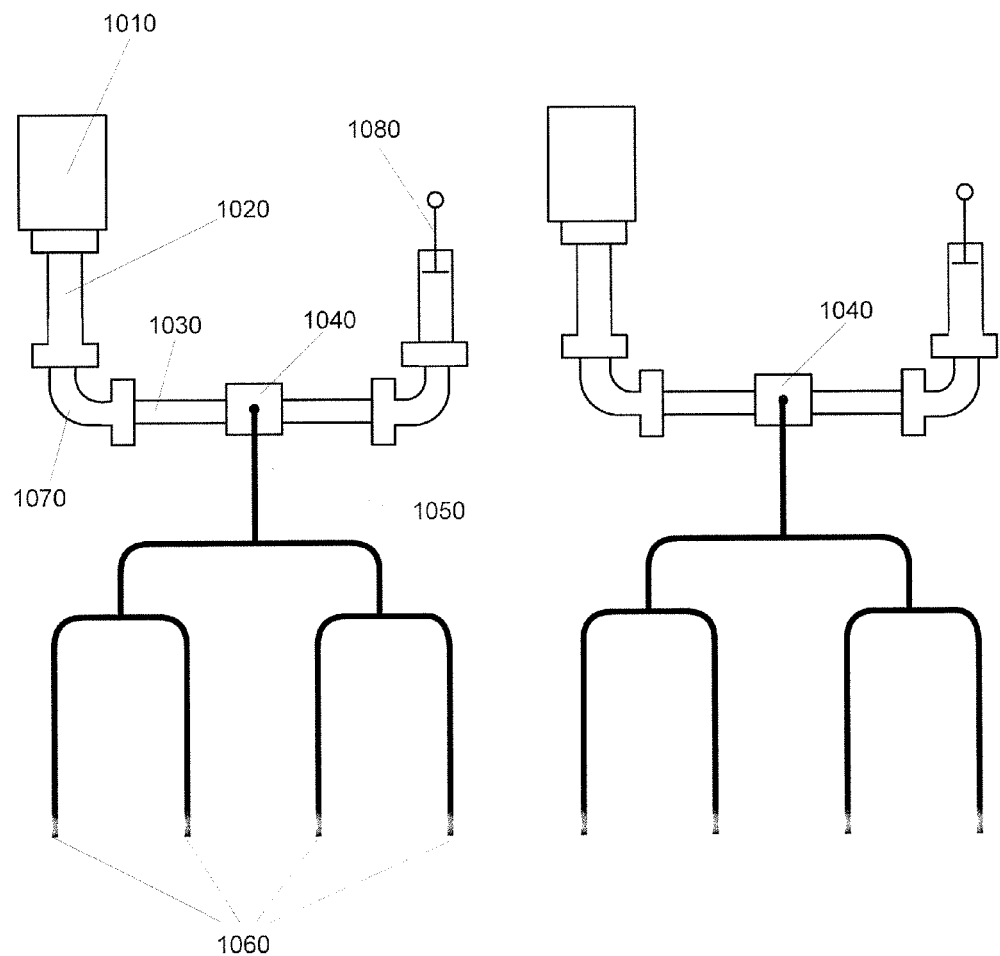
FIG. 10 is an illustration of a microwave waveguide with cascaded antenna.

Referring back to FIGS. 8 and 9, each contains a static array of discharge tubes 110. Within each discharge tube is an antenna 115. Each antenna 115 may be a linear antenna, split antenna, non-linear antenna, etc. The use of a dielectric coating 520 in order to create a containment shield can help to reduce the size of the containment shield and thus reduce spacing required between the antennas 115 in a static array. With reduced spacing between the antennas 115, more uniform film properties can be achieved. In small systems, an antenna may be cascaded multiple times as shown in FIG. 10 and power split between each of the cascaded antenna 1060.

However, given the power limitations for currently used generators, this configuration will not produce effective power densities for larger systems.

Moreover, in a typical application of coaxial microwave, the microwave generator 1010 is located as close as possible to the antenna stub 1040 and antenna 1050 to minimize power loss. FIG. 10 shows a microwave waveguide 1020, impedance transition 1030, elbow 1070, and movable plunger 1080 consistent with existing technology. As can be seen in FIG. 10, the length of the waveguide 1020 and impedance transition 1030 keeps the microwave generator 1010 away from the antenna stub 1040 and antenna 1050. Beyond the increased power losses due to the greater distance between the microwave generator 1010 and the antenna stub 1040, the size of the waveguide 1020 and impedance transition 1030 has made it unwieldy and difficult to construct and house PECVD systems. With existing technology, the manufacture of PECVD systems has been limited by the availability of individual waveguide parts. Integrating the waveguide 1020 and the impedance transition 1030 can decrease the size of the waveguide for both usability and power efficiency.

Figure 11:
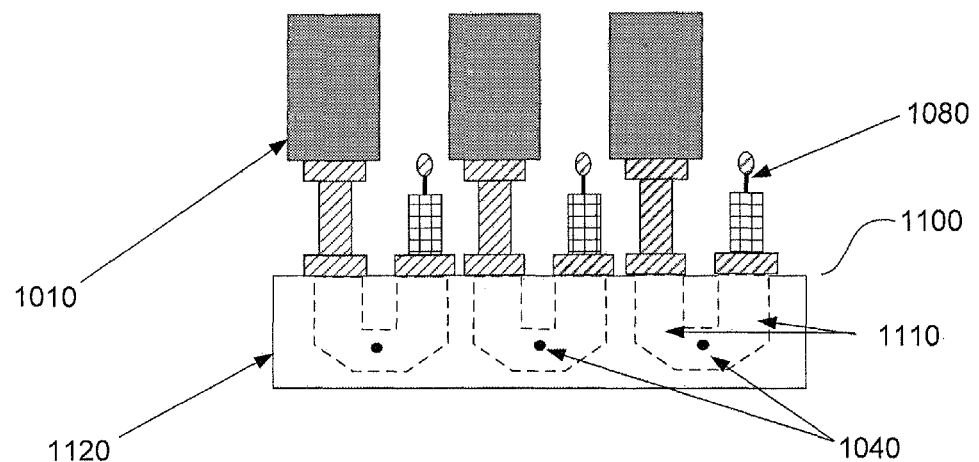
FIG. 11 illustrates a microwave waveguide with impedance transition constructed in accordance with one embodiment of the present invention.
Figure 12:
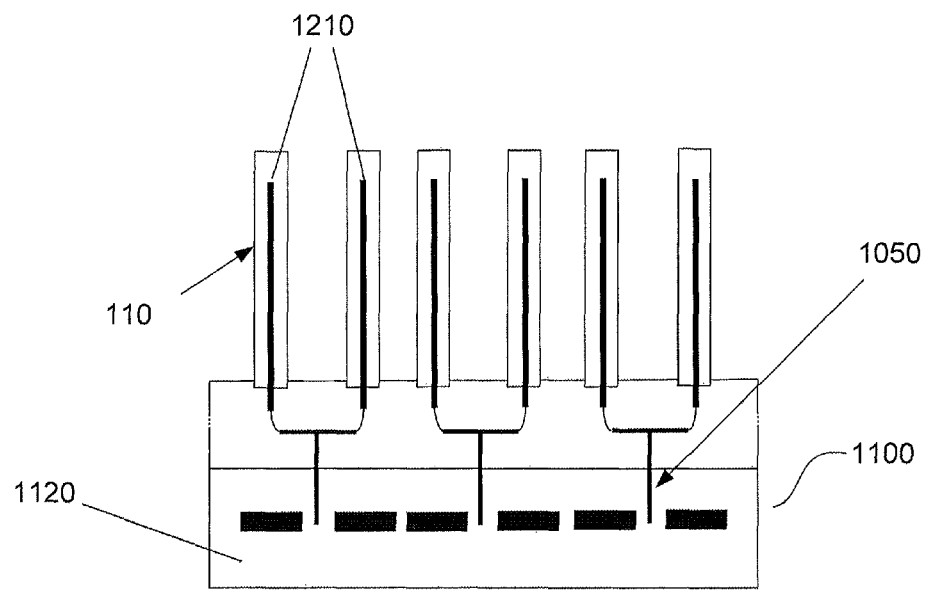
FIG. 12 illustrates antenna configured in accordance with one embodiment of the present invention.

FIGS. 11 and 12 illustrate an integrated microwave waveguide with impedance transition 1100 consistent with the present invention. As can be seen in FIG. 11, by integrating the waveguide and impedance transition (the integrated waveguide with impedance transition 1110) into a waveguide block 1120, the microwave generator 1010 can be placed closer to the antenna stub 1040 and antenna 1050 (FIG. 12) to increase power density. While the waveguide block 1120 is depicted in FIGS. 11 and 12 as a single piece of material, inside of which is the integrated waveguide with impedance transition 1110, that depiction is in no way intended to limit the present invention. In another embodiment, the waveguide block 1120 could comprise two pieces of material where the integrated waveguide with impedance transition 1110 is connected at the antenna stub 1040. Those skilled in the art will realize there are many modifications that can be made consistent with the present invention.

Figure 13:
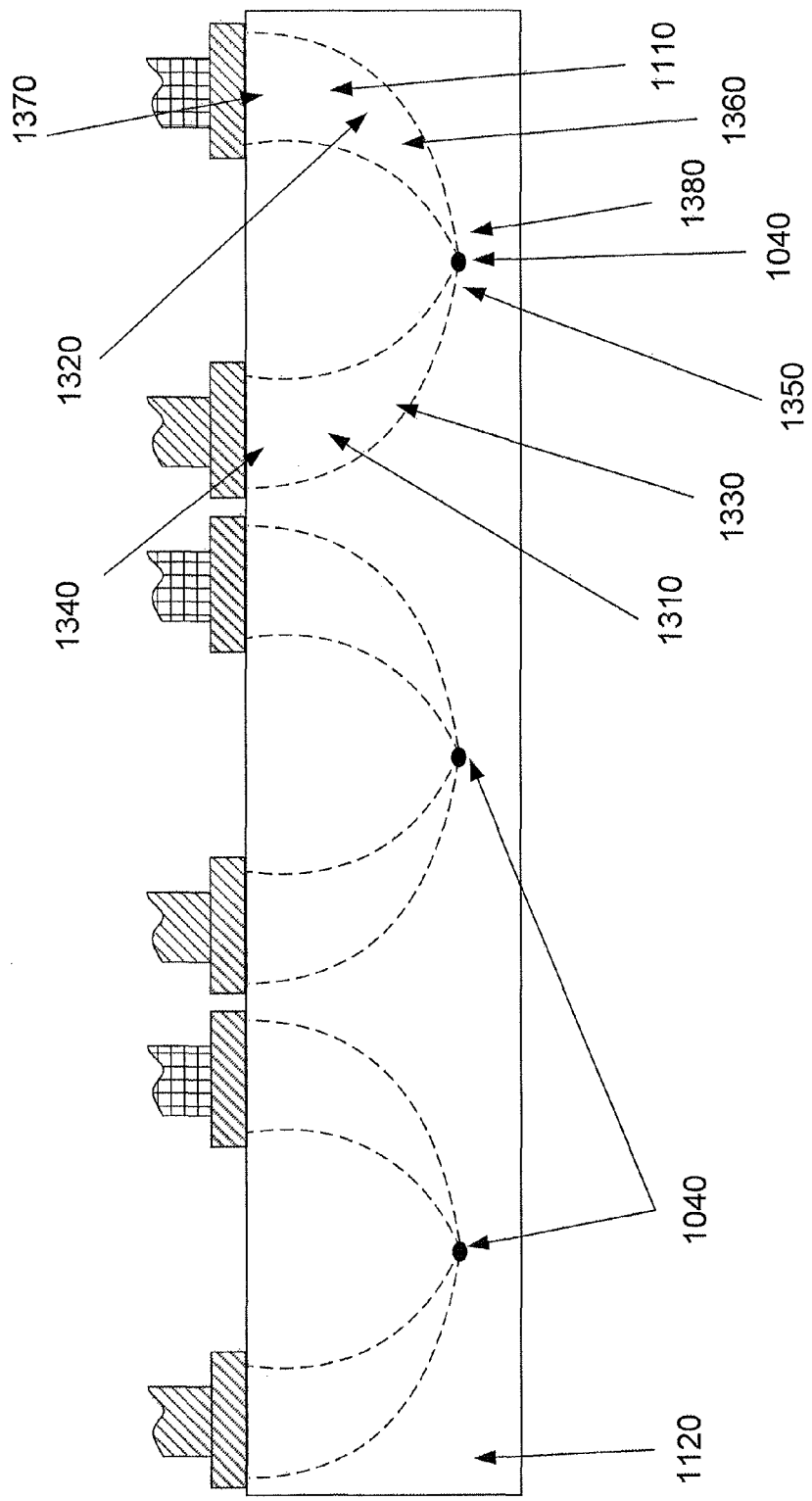
FIG. 13 illustrates a microwave waveguide with impedance transition constructed in accordance with one embodiment of the present invention.

In one embodiment of the present invention, the integrated waveguide with impedance transition 1110 can be machined into a waveguide block 1120 comprised of aluminum, copper, brass, or silver. This could be done by properly machining two tapered conduits into the waveguide block 1120 so that the tapered conduits start at the surface of the waveguide block and end at an antenna stub 1040, as shown in FIG. 13. In this embodiment, the microwave signal can be transitioned throughout the waveguide section, fully integrating the waveguide 1020 (FIG. 10) and impedance transition 1030 (FIG. 10) into an integrated waveguide with impedance transition 1110. In such an embodiment, the integrated waveguide with impedance transition 1110 essentially eliminates any separate waveguide section. This allows a waveguide block, with an integrated microwave waveguide to be built much smaller than waveguides like that shown in FIG. 10 that have to use separate waveguide sections 1020, elbows 1070 and impedance transition sections 1030.

One embodiment includes, as shown in FIG. 13, an integrated microwave waveguide comprising a waveguide block 1120, a first waveguide section 1310 in the waveguide block 1120, a second waveguide section 1320 in the waveguide block 1120, a first impedance transition section 1330 integrated with the first waveguide section 1310 in the waveguide block 1120, wherein the first impedance transition section 1330 comprises a first conduit with a first end 1340 and a second end 1350, wherein the first conduit is tapered from the first end to the second end, and a second impedance transition section 1360 integrated with the second waveguide section 1320 in the waveguide block 1120, wherein the second impedance transition section 1360 comprises a second conduit with a third end 1370 and a fourth end 1380, wherein the second conduit is tapered from the third end 1370 to the fourth end 1380, and wherein the second end 1350 of the first impedance transition section 1330 and the fourth end 1380 of the second impedance transition section 1360 are connected at an antenna stub 1040. The first end 1340 of the first impedance transition section 1130 is connected to a surface of the waveguide block 1120, and the third end 1370 of the second impedance transition section 1360 is connected to a surface of the waveguide block 1120.

In another embodiment, two conduits can be machined into the waveguide block 1120 to form waveguide sections. These conduits would form channels from the surface of, and into, the waveguide block 1120. These channels could then be connected with impedance transition sections to form the integrated waveguide with impedance transition 1110. In this embodiment, the waveguide section and transition section are partially integrated in order to form the integrated waveguide with impedance transition 1110. Those skilled in the art will be aware of various modifications and alternatives consistent with the present invention.

Figure 14:
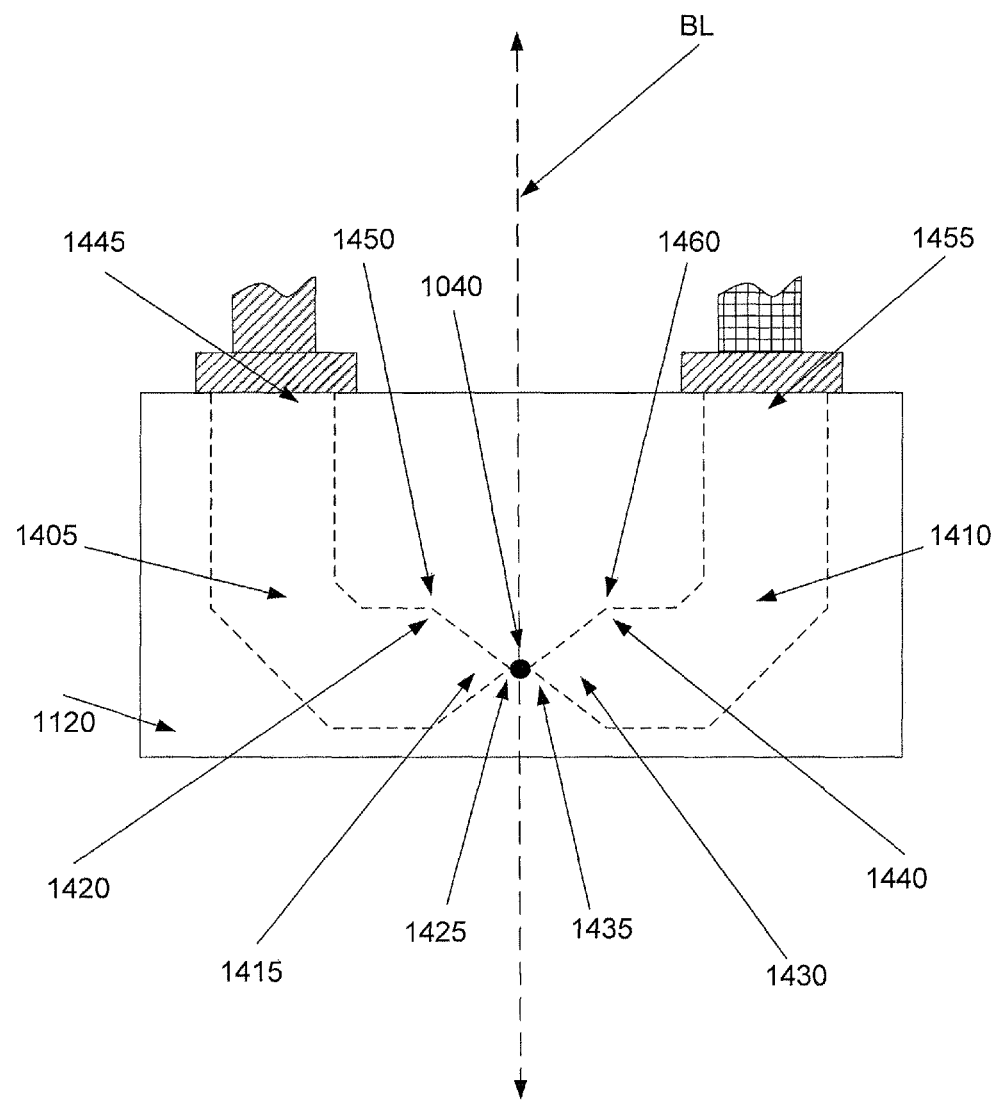
FIG. 14 illustrates a microwave waveguide with impedance transition constructed in accordance with one embodiment of the present invention.

Another embodiment includes, as shown in FIG. 14, a first waveguide section 1405 in the waveguide block 1120, a second waveguide section 1410 in the waveguide block 1120, a first impedance transition section 1415 integrated with the first waveguide section 1405 in the waveguide block 1120, wherein the first impedance transition section 1415 comprises a first conduit with a first end 1420 and a second end 1425, wherein the first conduit is tapered from the first end to the second end, and a second impedance transition section 1430 integrated with the second waveguide section 1410 in the waveguide block 1120, wherein the second impedance transition section 1430 comprises a second conduit with a third end 1435 and a fourth end 1440, wherein the second conduit is tapered from the third end 1435 to the fourth end 1440, and wherein the second end 1425 of the first impedance transition section 1415 and the fourth end 1440 of the second impedance transition section 1430 are connected at an antenna stub 1040. This embodiment can also include a third conduit in the first waveguide section 1405 with a fifth end 1445 and a sixth end 1450, wherein the fifth end 1450 of the first waveguide section 1405 is connected to a surface of the waveguide block 1120, and wherein the sixth end 1450 of the first waveguide section 1405 is connected to the first end 1420 of the first impedance transition section 1415. This embodiment can also include a fourth conduit in the second waveguide section 1410 with a seventh end 1455 and an eighth end 1460, wherein the seventh end 1455 of the second waveguide section 1410 is connected to the surface of the waveguide block, and wherein the eighth end 1460 of the second waveguide section 1410 is connected to the third end 1435 of the second impedance transition section 1430. While the waveguide block 1120 is depicted in FIG. 14 as a single piece of material, that depiction is in no way intended to limit the present invention. In another embodiment, the waveguide block 1120 could comprise two pieces of material connected as shown in FIG. 14 at break line BL. Those skilled in the art will realize there are many modifications that can be made consistent with the present invention.

Also illustrated in FIGS. 11 and 12 is a movable plunger 1080 (FIG. 11) disposed on a side of the integrated waveguide 1100 opposite the microwave generator 1010 consistent with the present invention. The movable plunger 1080 can be moved in order to tune the waveguide. In FIGS. 11 and 12, the movable plunger 1080 can be displaced up or down to move a microwave node to the antenna stub 1040.

In addition to minimizing the space for components, it has also been found that by turning the integrated microwave waveguide 1100 (FIG. 11) 90-degrees as compared to the antenna 1050, as illustrated in FIG. 12, the power density is increased further. In one embodiment, a single cascade power split antenna 1210 could be used with the present invention. As shown in FIGS. 11 and 12, the antenna stubs 1040 (FIG. 11) in the present invention can be located much closer than antenna stubs 1040 in FIG. 10. Since the antenna stubs 1040 are located closer together, the antenna 1050 does not have to be power split as many times in order to get to the desired spacing. For larger systems, the present invention makes it possible to achieve effect power densities not previously possible. Those skilled in the art will realize there are many modifications that can be made consistent with the present invention.

In conclusion, the present invention provides, among other things, a system and method for producing electrons, ions and radicalized atoms and molecules for surface treatment and film chemistry, and film structure, formation and alteration. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. An integrated microwave waveguide comprising:
a waveguide block;
a first waveguide section in the waveguide block;
a second waveguide section in the waveguide block;
a first impedance transition section integrated with the first waveguide section in the waveguide block, wherein the first impedance section comprises a first conduit with a first end and a second end, wherein the first conduit is tapered from the first end to the second end; and
a second impedance transition section integrated with the second waveguide section in the waveguide block, wherein the second impedance section comprises a second conduit with a third end and a fourth end, wherein the second conduit is tapered from the third end to the fourth end, and wherein the second end of the first impedance transition section and the fourth end of the second impedance transition section are connected at an antenna stub.

2. The integrated microwave waveguide of claim 1, wherein the first waveguide section comprises a third conduit with a fifth end and a sixth end, wherein the fifth end of the first waveguide section is connected to a surface of the waveguide block.

3. The integrated microwave waveguide of claim 2, wherein the second waveguide section comprises a fourth conduit with a seventh end and an eighth end, wherein the seventh end of the second waveguide section is connected to the surface of the waveguide block.

4. The integrated microwave waveguide of claim 1, wherein the first end of the first impedance transition section is connected to a surface of the waveguide block.

5. The integrated microwave waveguide of claim 2, wherein the sixth end of the first waveguide section is connected to the first end of the first impedance transition section.

6. The integrated microwave waveguide of claim 1, wherein the third end of the second impedance transition section is connected to a surface of the waveguide block.

7. The integrated microwave waveguide of claim 3, wherein the eighth end of the second waveguide section is connected to the third end of the second impedance transition section.

8. The integrated microwave waveguide of claim 1, wherein the waveguide block is a dual piece waveguide block.

9. The integrated microwave waveguide of claim 1, wherein the antenna stub is configured for an antenna aligned at an approximately 90-degree angle to the first waveguide section and the first impedance transition section.

10. The integrated microwave waveguide of claim 1 further comprising:
a microwave generator connected to the first waveguide section; and
a movable plunger connected to the second waveguide section.

11. The integrated microwave waveguide of claim 1, wherein the waveguide block is comprised of at least one of aluminum, copper, brass, and silver.

\* \* \* \* \*